(12) United States Patent
Harame et al.

(10) Patent No.: US 9,553,145 B2
(45) Date of Patent: Jan. 24, 2017

(54) LATERAL BIPOLAR JUNCTION TRANSISTORS ON A SILICON-ON-INSULATOR SUBSTRATE WITH A THIN DEVICE LAYER THICKNESS

(71) Applicant: GLOBALFOUNDRIES INC., Grand Cayman (KY)

(72) Inventors: David L. Harame, Essex Junction, VT (US); Michael L. Kerbaugh, Williston, VT (US); Qizhi Liu, Lexington, MA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/476,007

(22) Filed: Sep. 3, 2014

(65) Prior Publication Data

US 2016/0064484 A1    Mar. 3, 2016

(51) Int. Cl.
| | |
|---|---|
| *H01L 29/737* | (2006.01) |
| *H01L 29/10* | (2006.01) |
| *H01L 29/732* | (2006.01) |
| *H01L 27/12* | (2006.01) |
| *H01L 21/84* | (2006.01) |
| *H01L 29/08* | (2006.01) |
| *H01L 29/417* | (2006.01) |
| *H01L 29/66* | (2006.01) |

(52) U.S. Cl.
CPC .......... *H01L 29/1004* (2013.01); *H01L 21/84* (2013.01); *H01L 27/12* (2013.01); *H01L 29/0821* (2013.01); *H01L 29/41708* (2013.01); *H01L 29/66272* (2013.01); *H01L 29/732* (2013.01)

(58) Field of Classification Search
None
See application file for complete search history.

(56) References Cited

U.S. PATENT DOCUMENTS

| | | | |
|---|---|---|---|
| 5,387,808 A * | 2/1995 | Nozu | H01L 29/737 257/197 |
| 6,281,097 B1 * | 8/2001 | Aoyama | H01L 29/7378 257/E21.371 |
| 6,429,085 B1 | 8/2002 | Pinter | |

(Continued)

FOREIGN PATENT DOCUMENTS

JP    2002124588 A    4/2002

*Primary Examiner* — Ali Naraghi
(74) *Attorney, Agent, or Firm* — Thompson Hine LLP; Anthony Canale (57) ABSTRACT

Methods of forming bipolar device structures and bipolar device structures. An opening may be formed in a device layer of a silicon-on-insulator substrate that extends to a buried insulator layer of the silicon-on-insulator substrate. An intrinsic base layer may be grown within the device layer opening by lateral growth on opposite first and second sidewalls of the device layer bordering the opening. A first collector of a first bipolar junction transistor of the device structure may be formed at a first spacing from the first sidewall. A second collector of a second bipolar junction transistor of the device structure may be formed at a second spacing from the second sidewall. An emitter, which is shared by the first bipolar junction transistor and the second bipolar transistor, is formed inside the opening. Portions of the intrinsic base layer may supply respective intrinsic bases for the first and second bipolar junction transistors.

14 Claims, 10 Drawing Sheets

(56) References Cited

U.S. PATENT DOCUMENTS

| | | | |
|---|---|---|---|
| 6,555,874 B1 | 4/2003 | Hsu et al. | |
| 6,762,106 B2 * | 7/2004 | Aoki | H01L 21/02381 |
| | | | 257/E21.102 |
| 6,781,214 B1 * | 8/2004 | U'Ren | H01L 21/8249 |
| | | | 257/591 |
| 6,812,533 B2 | 11/2004 | Cai et al. | |
| 7,517,768 B2 | 4/2009 | Soman et al. | |
| 7,534,680 B2 | 5/2009 | Kang et al. | |
| 7,943,995 B2 | 5/2011 | Kang et al. | |
| 8,039,351 B2 | 10/2011 | Adam et al. | |
| 8,288,758 B2 | 10/2012 | Ning et al. | |
| 8,420,493 B2 | 4/2013 | Ning et al. | |
| 8,441,084 B2 | 5/2013 | Cai et al. | |
| 8,557,670 B1 | 10/2013 | Cai et al. | |
| 8,575,655 B2 | 11/2013 | Bedell et al. | |
| 2010/0025808 A1 * | 2/2010 | Donkers et al. | 257/526 |
| 2011/0304019 A1 * | 12/2011 | Meunier-Beillard | H01L 29/7378 |
| | | | 257/565 |
| 2011/0309471 A1 * | 12/2011 | Camillo-Castillo | H01L 29/66242 |
| | | | 257/526 |
| 2012/0223420 A1 * | 9/2012 | Schulze et al. | 257/647 |
| 2013/0092939 A1 * | 4/2013 | Kim | H01L 29/66272 |
| | | | 257/51 |
| 2013/0178037 A1 * | 7/2013 | Meunier-Beillard et al. | 438/318 |
| 2013/0187173 A1 * | 7/2013 | Domeij | H01L 29/1004 |
| | | | 257/77 |
| 2013/0207235 A1 * | 8/2013 | Faucher | H01L 29/66234 |
| | | | 257/565 |

* cited by examiner

LATERAL BIPOLAR JUNCTION TRANSISTORS ON A SILICON-ON-INSULATOR SUBSTRATE WITH A THIN DEVICE LAYER THICKNESS

BACKGROUND

The invention relates generally to semiconductor devices and integrated circuit fabrication and, in particular, to device structures and fabrication methods for the bipolar junction transistors of a bipolar device.

Bipolar junction transistors may be found, among other end uses, in high-frequency and high-power applications. In particular, bipolar junction transistors may be used in microwave power amplifiers used in wireless communications systems and power amplifiers in mobile devices. Bipolar junction transistors may also be used in high-speed logic circuits.

Bipolar junction transistors are three-terminal electronic devices that include semiconductor regions defining an emitter, an intrinsic base, and a collector. An NPN bipolar junction transistor includes two regions of n-type semiconductor material constituting the emitter and collector, and a region of p-type semiconductor material constituting the intrinsic base situated between the two regions of n-type semiconductor material. A PNP bipolar junction transistor includes two regions of p-type semiconductor material constituting the emitter and collector, and a region of n-type semiconductor material constituting the intrinsic base situated between the two regions of p-type semiconductor material. The emitter, intrinsic base, and collector define a pair of p-n junctions, namely a collector-base junction and an emitter-base junction, across which the conductivity type of the respective semiconductor materials changes. A voltage applied across the emitter-base junction controls the movement of charge carriers that produces charge flow between the collector and emitter.

Improved device structures and fabrication methods are needed for a bipolar device.

SUMMARY

In an embodiment of the invention, a method is provided for forming a bipolar device structure. An opening is formed in a device layer of a silicon-on-insulator substrate that extends to a buried insulator layer of the silicon-on-insulator substrate. An intrinsic base layer is epitaxially grown within the opening in the device layer by lateral growth from a first sidewall and a second sidewall of the device layer that border the opening.

In an embodiment of the invention, a method of forming a bipolar device structure includes forming an opening in a device layer of a silicon-on-insulator substrate with a first sidewall and a second sidewall opposite from the first sidewall that each extend to a buried insulator layer of the silicon-on-insulator substrate. A first collector of a first bipolar junction transistor is formed at a first spacing from the first sidewall. A second collector of a second bipolar junction transistor is formed at a second spacing from the second sidewall. An emitter, which is shared by the first and second bipolar junction transistors, is formed inside the opening.

In an embodiment of the invention, a bipolar device structure is formed using an opening in a device layer of a silicon-on-insulator substrate that extends to a buried insulator layer of the silicon-on-insulator substrate. The bipolar device structure includes a first bipolar junction transistor with a first intrinsic base and a first collector. The first intrinsic base is located on a first sidewall of the device layer bordering the opening and extending to a buried insulator layer of the silicon-on-insulator substrate. The first collector is located in the device layer at a first spacing from the first sidewall. The bipolar device structure includes a second bipolar junction transistor with a second intrinsic base and a second collector. The second intrinsic base is located on a second sidewall of the device layer bordering the opening and extending to the buried insulator layer of the silicon-on-insulator substrate. The second collector is located in the device layer at a second spacing from the second sidewall.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
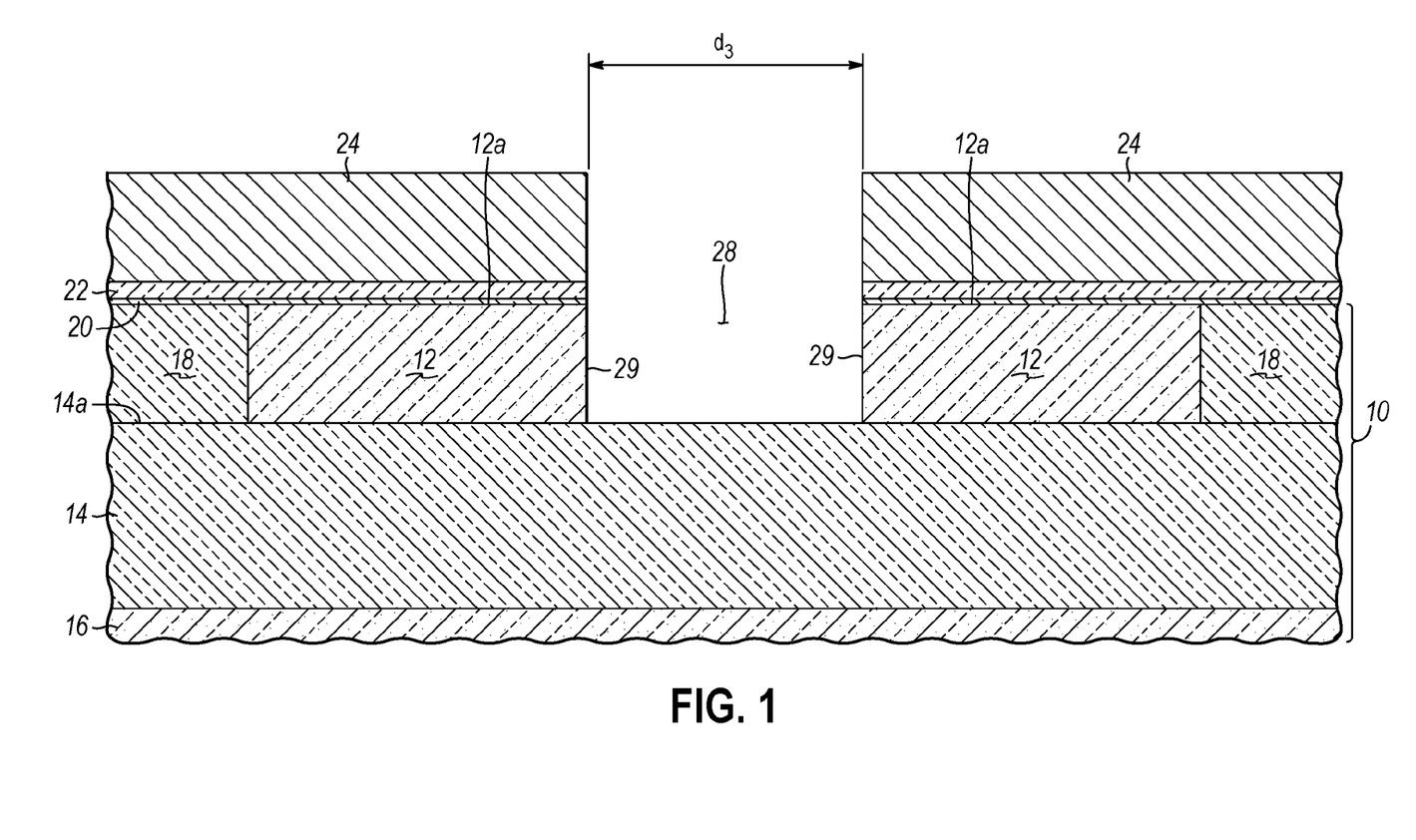
FIGS. 1-9 are cross-sectional views of a portion of a substrate at successive fabrication stages of a processing method for fabricating a device structure in accordance with an embodiment of the invention.

With reference to FIG. 1 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 14 and is considerably thinner than the handle wafer 16. The device layer 12 is supported on a top surface 14a of the buried insulator layer 14 and is electrically insulated from the handle wafer 16 by the buried insulator layer 14. The buried insulator layer 14 may be comprised of an electrical insulator and, in particular, may constitute a buried oxide layer composed of silicon dioxide (e.g., $SiO_2$).

Trench isolation regions 18 may be formed in the device layer 12 of the substrate 10 by depositing a hardmask, patterning the hardmask and device layer 12 with lithography and etching processes to define trenches, depositing an electrical insulator to fill the trenches, planarizing the electrical insulator relative to the hardmask using a chemical mechanical polishing (CMP) process, and removing the hardmask. In one embodiment, the trench isolation regions 18 may be comprised of silicon dioxide ($SiO_2$) deposited by low pressure chemical vapor phase deposition (LPCVD), and may penetrate completely through the device layer 12 to the top surface 14a of the buried insulator layer 14.

Dielectric layers 20, 22 are serially formed on a top surface 12a of the semiconductor layer 12. Dielectric layer 20 may be comprised of an electrical insulator, such as silicon dioxide ($SiO_2$) deposited using chemical vapor deposition (CVD). Dielectric layer 22 may be comprised of a different electrical insulator, such as silicon nitride ($Si_3N_4$) deposited using CVD, and may be thicker than dielectric layer 20.

A patterned mask 24 is formed on a top surface of the dielectric layer 22. The mask 24 may be comprised of a layer of sacrificial material that is applied and patterned with photolithography. To that end, the sacrificial material layer may be comprised of a photoresist that is applied by a spin coating process, pre-baked, exposed to a radiation projected through a photomask, baked after exposure, and developed with a chemical developer to form an opening in the patterned mask 24 at an intended location for an opening in the device layer 12. A dry etch process, such as a reactive ion etch (RIE), may be used to remove unmasked portions of the dielectric layers 20, 22 and device layer 12 to define an opening 28 of width, $d_3$, that is aligned with the opening in the mask 24. The opening 28 may penetrate through the device layer 12 to the top surface 14a of the buried insulator layer 14, and is bounded by opposite sidewalls 29 of the device layer 12. The opening 28 is subsequently used to form a base and emitter of the device structure.

Figure 2:
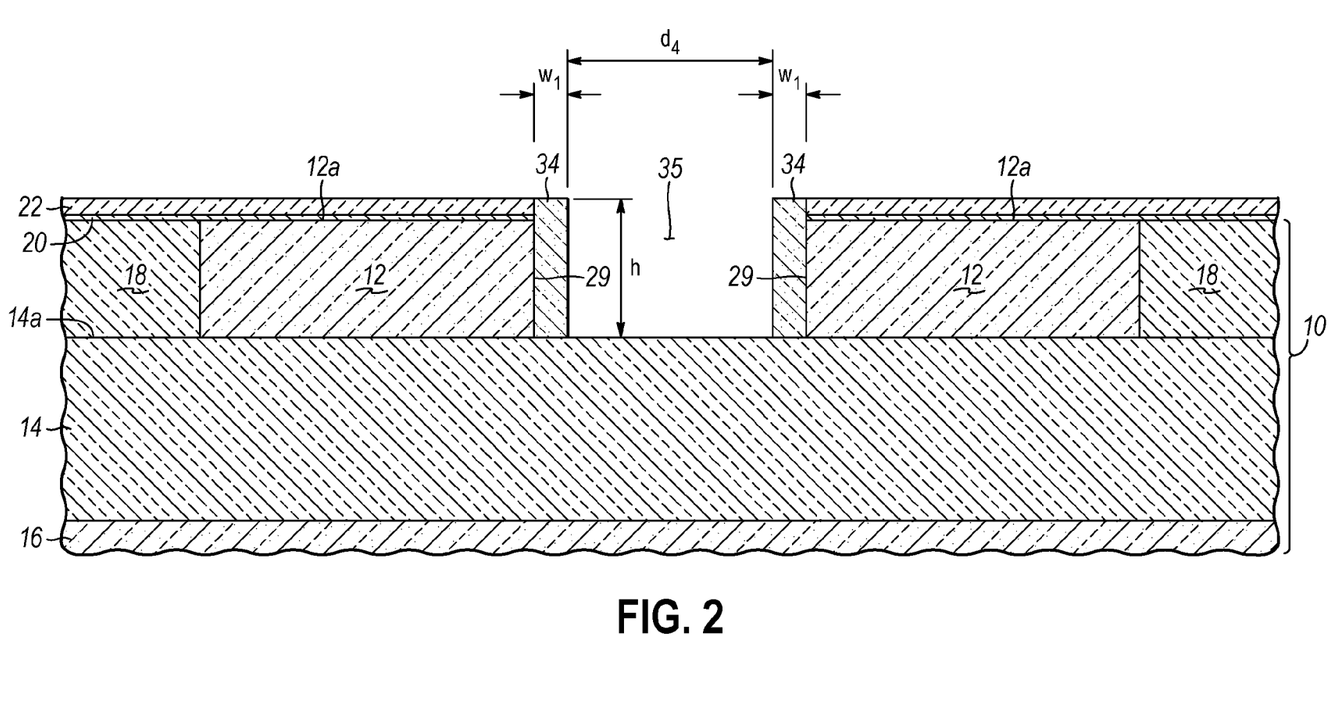
Figure 2A:
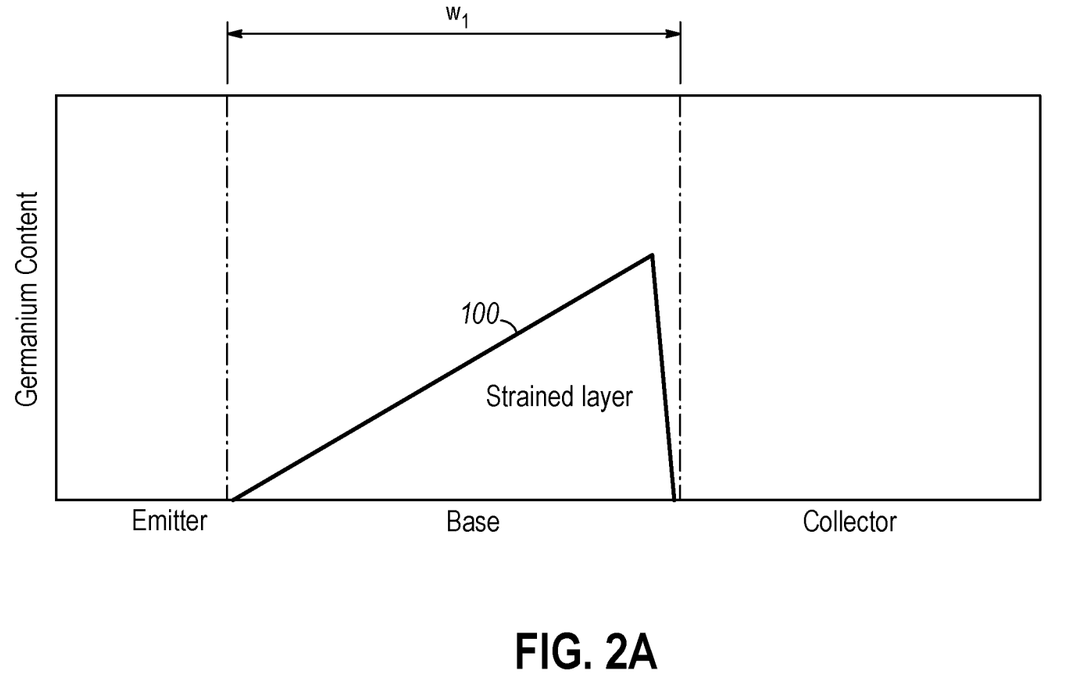
FIG. 2A is a diagrammatic view of the germanium concentration profile in the laterally-grown intrinsic base layer.

With reference to FIGS. 2, 2A in which like reference numerals refer to like features in FIG. 1 and at a subsequent fabrication stage of the processing method, an intrinsic base layer 34 is formed inside of the opening 28 in the device layer 12. A portion of the intrinsic base layer 34 is located on one of the sidewalls 29 of the device layer 12 bordering the opening 28. Another portion of the intrinsic base layer 34 is located on an opposite sidewall 29 of the device layer 12 bordering the opening 28. The opening 28 is narrowed from its initial width, $d_3$, after forming the intrinsic base layer 34. In particular, different portions of the intrinsic base layer 34 on opposite sidewalls 29 are separated by a width, $d_4$, which defines an emitter opening 35 between these different portions. The intrinsic base layer 34 is dimensionally characterized by a thickness or width, $w_1$, and a height, h, transverse to the width. The height of the intrinsic base layer 34 is nominally equal to the thickness of the device layer 12, and the width of the intrinsic base layer 34 is less than one half of the width, $d_3$, of the opening 28.

The intrinsic base layer 34 may be comprised of a semiconductor material, such as silicon-germanium (SiGe) including silicon (Si) and germanium (Ge) in a composition with a silicon content ranging from 95 atomic percent to 50 atomic percent and a germanium content 100 ranging from 5 atomic percent to 50 atomic percent, or SiGe:C with a composition having up to 10 percent carbon. The intrinsic base layer 34 may comprise a dopant, such as a p-type dopant selected from Group III of the Periodic Table (e.g., boron) in a concentration that is effective to impart p-type conductivity and, optionally, carbon (C) to suppress the outdiffusion of the p-type dopant. The intrinsic base layer 34 grows primarily inward in a lateral direction from the vertical plane of the sidewalls 29 toward a centerline of the opening 28. The intrinsic base layer 34 may include a thin layer of silicon lacking germanium at the interface with collector and another thin layer of silicon lacking germanium at the interface with the subsequently-formed emitter.

The semiconductor material of the intrinsic base layer 34 may be formed by a selective epitaxial growth (SEG) process. Epitaxial growth is a process by which the single-crystal semiconductor material of the intrinsic base layer 34 is deposited on the single-crystal semiconductor material of the device layer 12 and in which the crystallographic structure of the single-crystal material of the device layer 12 is reproduced in the semiconductor material of the intrinsic base layer 34. During epitaxial growth, the semiconductor material constituting the intrinsic base layer 34 will acquire the crystal orientation and crystal structure of single crystal semiconductor material of the device layer 12, which serves as a template for growth. Because the composition of the semiconductor material in the intrinsic base layer 34 differs from the chemical composition of the device layer 12, a lattice constant mismatch may be present between the semiconductor materials of the intrinsic base layer 34 and the device layer 12, which may incorporate strain into the intrinsic base layer 34. Because of the selective nature of a SEG process, the semiconductor material comprising the intrinsic base layer 34 does not grow on insulator surfaces.

As diagrammatically shown in FIG. 2A, the germanium content 100 of the intrinsic base layer 34 may vary with lateral position and, in particular, may vary in a lateral direction from the device layer 12 containing the subsequently-formed collector to the subsequently-formed emitter. In an embodiment, the germanium content 100 of the intrinsic base layer 34 may have a compositionally-graded profile that decreases with lateral position in a lateral direction from the device layer 12 containing the subsequently-formed collector to the subsequently-formed emitter. The vertical dot-dashed lines indicate the transitions in germanium content from the collector to the intrinsic base layer and from the intrinsic base layer to the emitter in the lateral device construction.

Figure 3:
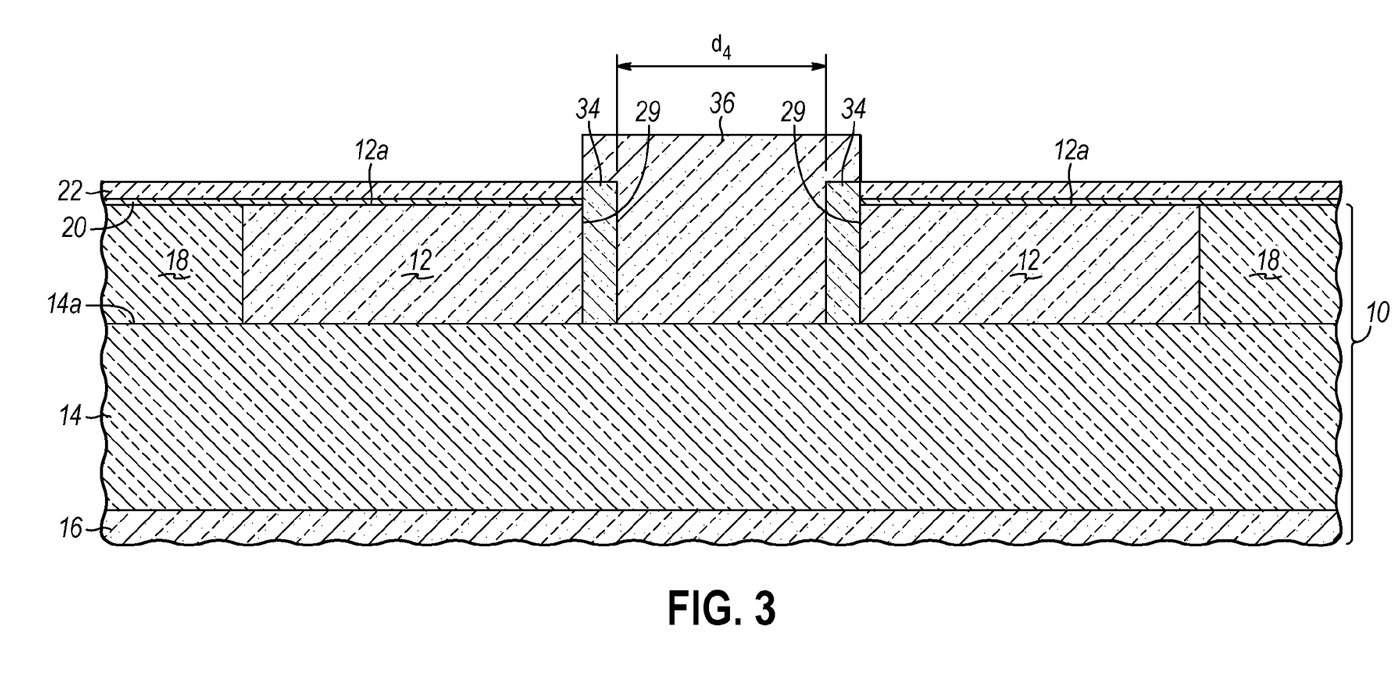

With reference to FIG. 3 in which like reference numerals refer to like features in FIG. 2 and at a subsequent fabrication stage of the processing method, an emitter 36 is formed inside the emitter opening 35 and occupies the portion of the opening 28 that is not occupied by the intrinsic base layer 34. The emitter 36 may be characterized by the width, $d_4$, of the emitter opening 35. In one embodiment, the emitter 36 may be comprised of a semiconductor material (e.g., silicon) formed by a selective epitaxial growth (SEG) deposition process. The composition of the semiconductor material in the intrinsic base layer 34 may be similar to the chemical composition of the intrinsic base layer 34 at their interface which may minimize any lattice constant mismatch between their semiconductor materials. The crystallographic structure and orientation of the single-crystal semiconductor material of the intrinsic base layer 34 is reproduced in the single-crystal semiconductor material of the emitter 36.

The single-crystal semiconductor material of the emitter 36 is deposited on the single-crystal semiconductor material of the intrinsic base layer 34, but does not form on insulator surfaces. Growth of the semiconductor material of emitter 36 initiates on the vertical sidewalls of the intrinsic base layer 34 lining the emitter opening 35 and grows inwardly toward the centerline of the opening 28. Growth of the semiconductor material of emitter 36 eventually transitions to inward and upward growth that fills the emitter opening 35, protrudes out of the emitter opening 35, and overlaps an adjacent portion of the top surface 34a of the intrinsic base layer 34. The primary growth direction of the semiconductor material of emitter 36 is in the lateral direction from the sidewalls of the intrinsic base layer 34.

Figure 4:
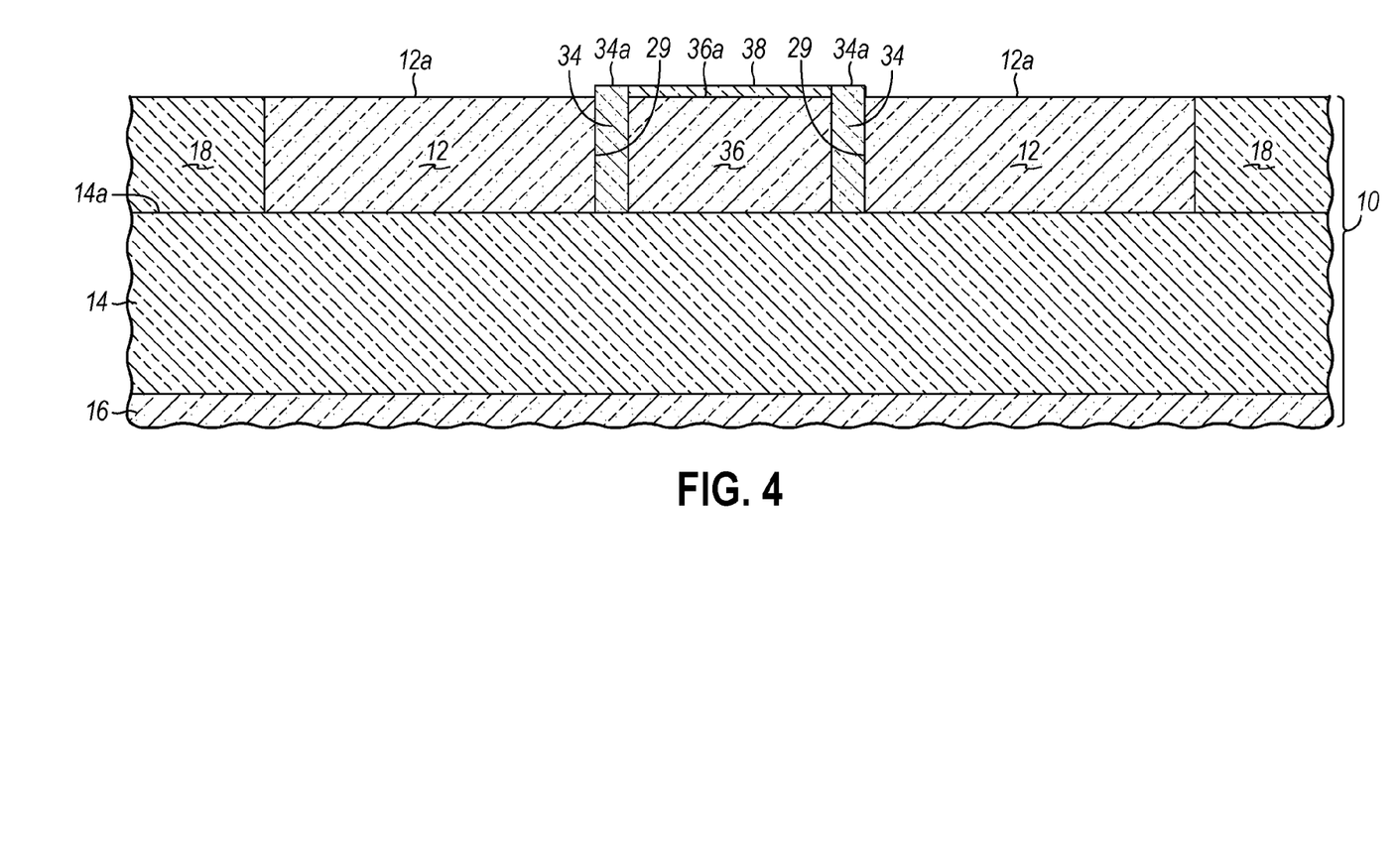

With reference to FIG. 4 in which like reference numerals refer to like features in FIG. 3 and at a subsequent fabrication stage of the processing method, an etching process is used to etch the semiconductor material of the emitter 36 selective to the semiconductor material of the intrinsic base layer 34. In one embodiment in which the emitter is comprised of silicon and the intrinsic base layer 34 is comprised of silicon-germanium, an ammonia hydroxide-based etch chemistry or a potassium hydroxide-based chemistry may be employed. At the conclusion of the etching process, the top surface 34a of the intrinsic base layer 34 is exposed and projects a small distance above a top surface 36a of the emitter 36.

A dielectric layer 38 is formed on portions of the top surface 34a of the intrinsic base layer 34 and the top surface 36a of the emitter 36 that are not covered by the dielectric layer 22. The dielectric layer 38 may be comprised of an electrical insulator, such as silicon dioxide ($SiO_2$) grown at a low temperature so as to not disturb the placement of the dopants by diffusion. The dielectric layer 22 is then removed with an etching process, such as a hot phosphoric acid etch if the dielectric layer 22 is comprised of silicon nitride, that removed the material of the dielectric layer 22 selective to the material of dielectric layer 38. The dielectric layer 38 is then removed by an etching process such as a hydrofluoric acid type procedure like a dilute hydrofluoric (DHF) or a buffered hydrofluoric (BHF) wet procedure. In an alternative embodiment, the dielectric layer 38 may be omitted from the process flow.

Figure 5:
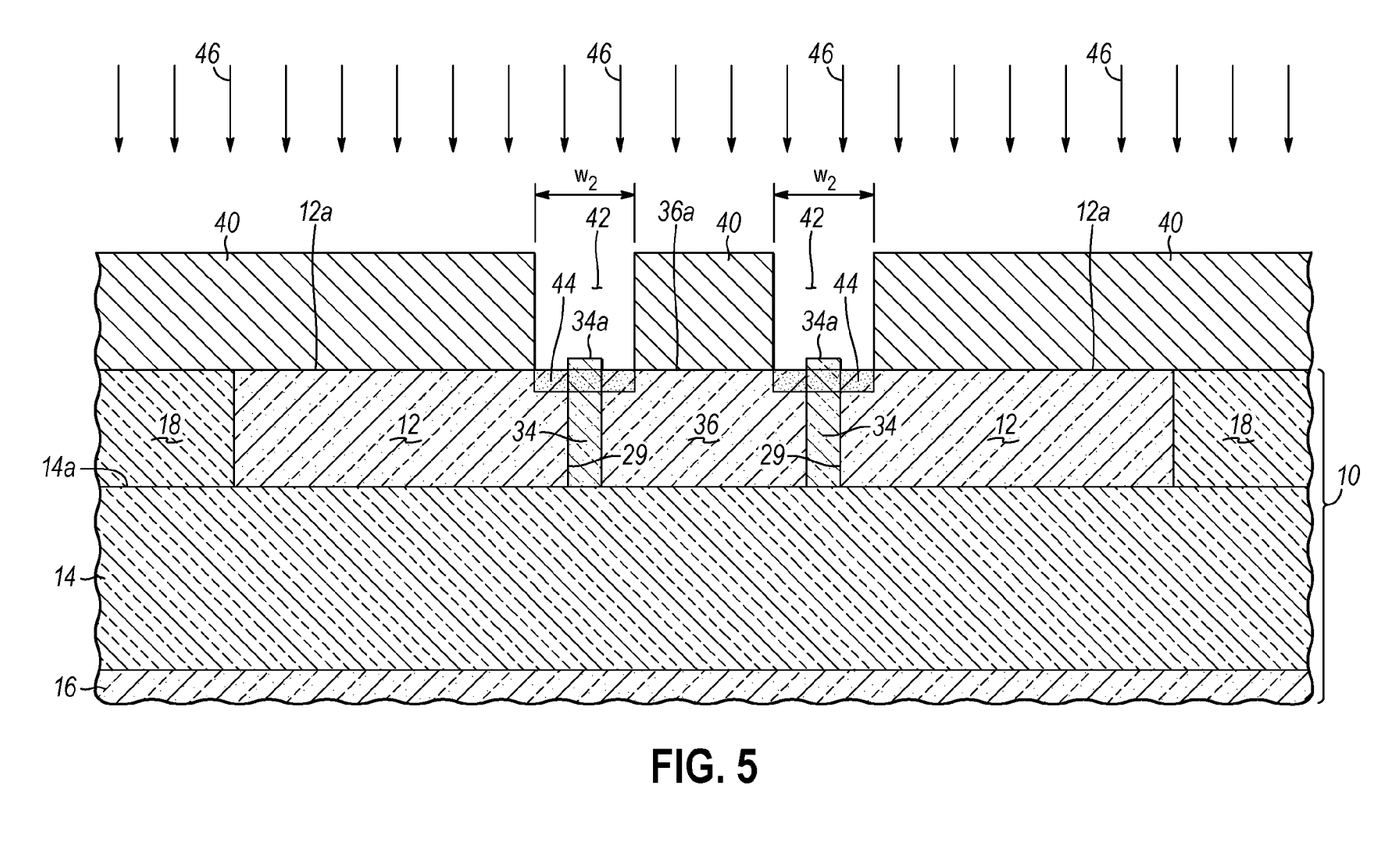

With reference to FIG. 5 in which like reference numerals refer to like features in FIG. 4 and at a subsequent fabrication stage of the processing method, a patterned mask 40 is formed that includes openings 42 aligned with an intended location of contact regions 44 for the intrinsic base layer 34. The mask 40 may be comprised of a layer of sacrificial material that is applied and patterned with photolithography. To that end, the sacrificial material layer may be comprised of a photoresist that is applied by a spin coating process, pre-baked, exposed to a radiation projected through a photomask, baked after exposure, and developed with a chemical developer to form openings 42 in the patterned mask 40. The openings 42 are aligned with portions of the intrinsic base layer 34 on the different sidewalls 29 and are each wider than the top surface 34a of the respective portion of the intrinsic base layer 34.

The contact regions 44 may be comprised of portions of the semiconductor materials of the device layer 12, the intrinsic base layer 34, and the emitter 36 doped with a dopant selected from Group V of the Periodic Table (e.g., phosphorus (P), arsenic (As), or antimony (Sb)) in order to impart n-type conductivity to the semiconductor material. The contact regions 44 may be formed by implanting ions 46 comprising the dopant in the presence of the patterned mask 40 that restricts dopant introduction into the semiconductor materials during implantation outside of the openings 42. The implantation conditions (e.g., kinetic energy and dose) for the ions 46 used to form the contact regions 44 are selected to provide a desired dopant concentration (e.g., heavy doping) and may include multiple implantation conditions. Following ion implantation, the mask 40 may be removed by, for example, oxygen plasma ashing or wet chemical stripping.

The contact regions 44 (i.e., the extrinsic bases of the device structure) respectively overlap with each of the different portions of the intrinsic base layer 34 (i.e., the intrinsic bases of the device structure). In a direction parallel to the normal to the top surface 12a of the device layer 12, the width, $w_2$, of each contact region 44 is greater than the width, $w_1$, of the intrinsic base layer 34 at its top surface 34a. The contact regions 44 effectively increase the surface area available to electrically contact the different portions of the intrinsic base layer 34.

Figure 6:
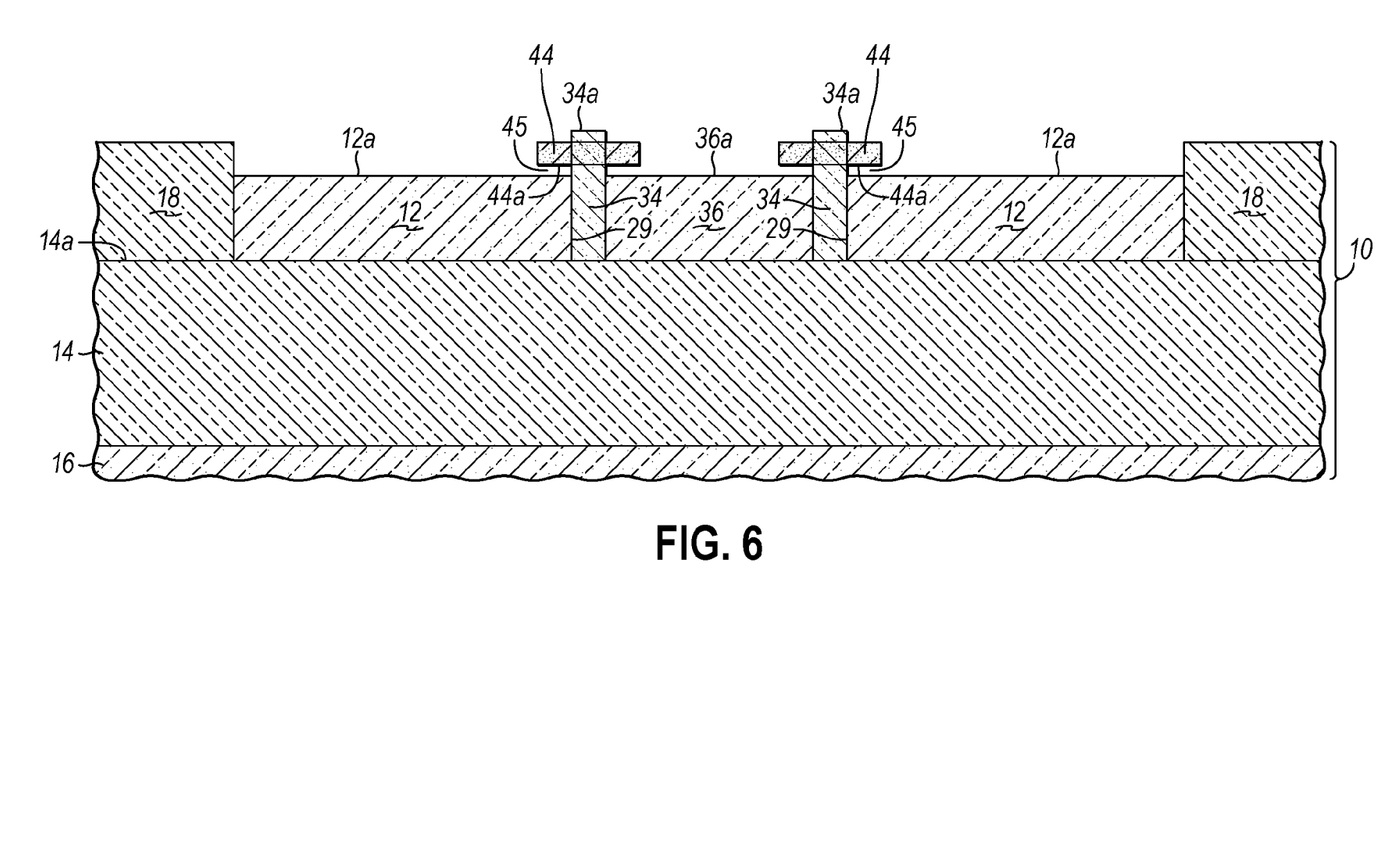

With reference to FIG. 6 in which like reference numerals refer to like features in FIG. 5 and at a subsequent fabrication stage of the processing method, a selective etching process is used to recess the emitter 36 and the device layer 12 relative to the intrinsic base layer 34 and the contact regions 44. The etching process, which may be timed, removes the semiconductor materials comprising the emitter 36 and the device layer 12 at a significantly higher rate than the semiconductor materials comprising the intrinsic base layer 34 and the contact regions 44. The etching process is isotropic so that the contact regions 44 are undercut to form respective gap 45 between a respective bottom surface 44a of each contact region 44 and the top surfaces 12a, 36a, respectively, of the emitter 36 and the device layer 12. The etching process may comprise a wet chemical etch with an etch chemistry that removes intrinsic silicon and lightly-doped silicon selective to (i.e., at a greater rate than) silicon-germanium and highly-doped silicon.

Figure 7:
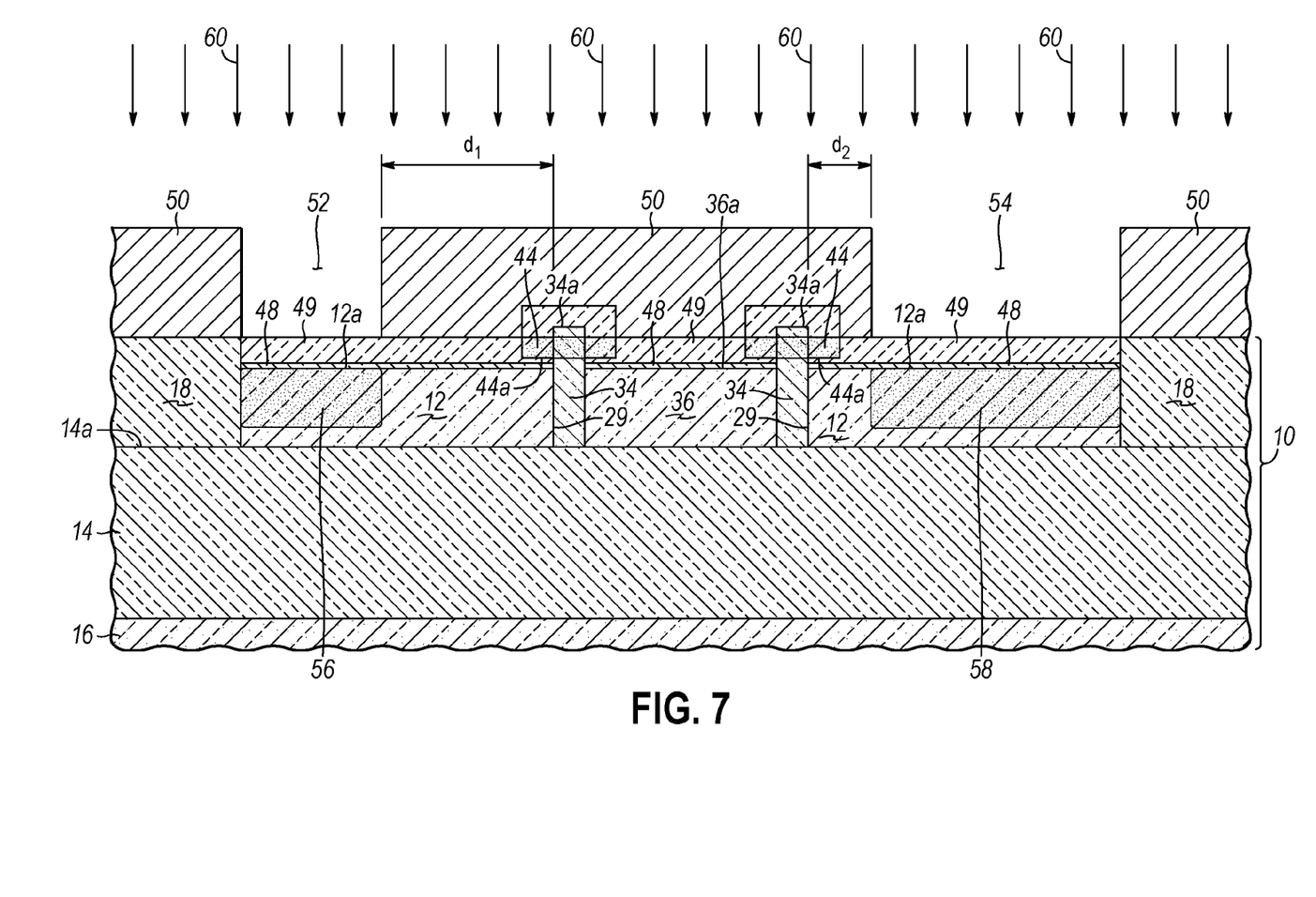

With reference to FIG. 7 in which like reference numerals refer to like features in FIG. 6 and at a subsequent fabrication stage of the processing method, dielectric layers 48, 49 are formed that conformally cover the device layer 12, the intrinsic base layer 34, the emitter 36, and the contact regions 44. Dielectric layer 48 may be comprised of an electrical insulator, such as silicon dioxide ($SiO_2$) deposited using CVD. Dielectric layer 49 may be comprised of a different electrical insulator, such as silicon nitride ($Si_3N_4$) deposited using CVD. Portions of one or both of the dielectric layers 48, 49 fills the gap 45 between the respective bottom surface 44a of each contact region 44 and the top surfaces 12a, 36a, respectively, of the emitter 36 and the device layer 12. In the completed device structure, the electrical insulator in the gap 45 electrically isolates the extrinsic base from the emitter and the collector regions.

A patterned mask 50 is formed that includes openings 52, 54 that are aligned with an intended location of collectors 56, 58 for the different bipolar junction transistors. The mask 50 may be comprised of a layer of sacrificial material that is applied and patterned with photolithography. To that end, the sacrificial material layer may be comprised of a photoresist that is applied by a spin coating process, pre-baked, exposed to a radiation projected through a photomask, baked after exposure, and developed with a chemical developer to form the openings 52, 54 in the patterned mask 50.

The collectors 56, 58 may be comprised of the semiconductor material of the device layer 12 doped with a dopant selected from Group V of the Periodic Table (e.g., phosphorus (P), arsenic (As), or antimony (Sb)) in order to impart n-type conductivity to the semiconductor material of the device layer 12. The collectors 56, 58 may be formed by implanting ions 60 comprising the dopant in the presence of the patterned mask 50, which provides an implant mask that controls dopant introduction into the semiconductor layer during implantation. The implantation conditions (e.g., kinetic energy and dose) for the ions 60 used to form the collectors 56, 58 are selected to provide a desired dopant concentration (e.g., high doping) and may include multiple implantation conditions.

In an embodiment, the opening 52 and the opening 54 may have an asymmetrical arrangement relative to the intrinsic base layer 34 and the emitter 36 so that the respective collectors 56, 58 have the same asymmetrical arrangement and different lateral spacings relative to the sidewalls 29 of the device layer 12 on which the intrinsic base layer 34 is grown. The collector 56 (and the corresponding opening 52) may have a spacing $d_1$ relative to the nearest sidewall 29 of the device layer 12 (i.e., the junction 74 (FIG. 8) with the portion of the intrinsic base layer 34 forming the intrinsic base 68). The collector 58 (and the corresponding opening 54) may have a spacing $d_2$ relative to the nearest sidewall 29 of the device layer 12 (i.e., (i.e., the junction 75 (FIG. 8) with the portion of the intrinsic base layer 34 forming the intrinsic base 69). In the representative embodiment, spacing $d_1$ is greater than spacing $d_2$. The breakdown voltage increases with increasing spacing such that, in the representative embodiment, the breakdown voltage for the bipolar junction transistor that includes collector 56 is greater than the breakdown voltage for the bipolar junction transistor that includes the collector 58. As a result, multiple breakdown voltages may be offered for different bipolar junction transistors on the same chip using only a single patterned mask 50.

The lateral spacings of the collectors 56, 58 may also be expressed relative to the shared emitter 36. The spacing for the collector 56 relative to the nearest edge of the shared emitter 36 (i.e., the junction 74 between the emitter 36 and the intrinsic base 68) is given by the sum of the width, w, of the intrinsic base layer 34 and the spacing, $d_1$. The spacing for the collector 58 relative to the nearest edge of the shared emitter 36 (i.e., the junction 73 between the emitter 36 and the intrinsic base 69) is given by the sum of the width of the intrinsic base layer 34 and the spacing, $d_2$. Because the width of the intrinsic base layer 34 is uniform, the relationship between the spacings is preserved if expressed relative to the shared emitter 36.

In an alternative embodiment, the opening 52 and the opening 54 may have a symmetrical arrangement relative to the intrinsic base layer 34 and the emitter 36 so that the respective collectors 56, 58 have the same spacing relative to the intrinsic base layer 34 and the shared emitter 36. The bipolar junction transistors of the bipolar device according to this embodiment would be characterized by the same breakdown voltage, and are coupled in parallel.

Figure 8:
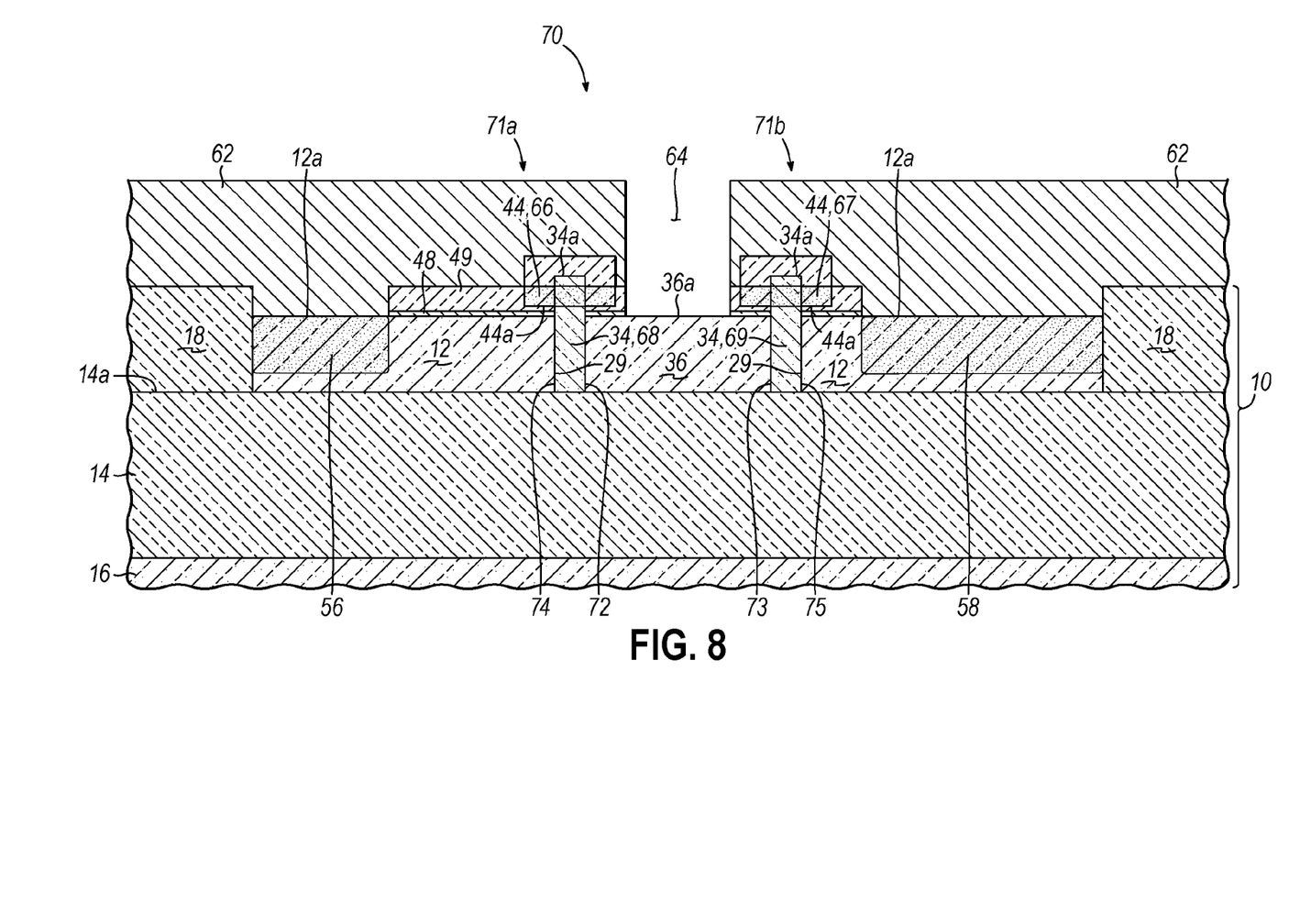

With reference to FIG. 8 in which like reference numerals refer to like features in FIG. 7 and at a subsequent fabrication stage of the processing method, portions of the dielectric layers 48, 49 are removed with an etching process from within the opening 52 and the opening 54 of the mask 50, which is also purposed to provide an etch mask while etching portions of the dielectric layer 49. After etching is complete, the mask 50 may be removed by, for example, oxygen plasma ashing or wet chemical stripping. The exposure of the portions of the top surface 12a of the device layer 12 provides access to form respective contacts to the collectors 56, 58.

A patterned mask 62 is formed that includes an opening 64 that is aligned with the emitter 36. The mask 62 may be comprised of a layer of sacrificial material that is applied and patterned with photolithography. To that end, the sacrificial material layer may be comprised of a photoresist that is applied by a spin coating process, pre-baked, exposed to a radiation projected through a photomask, baked after exposure, and developed with a chemical developer to form the opening 64 in the patterned mask 62. Portions of the dielectric layers 48, 49 aligned with the opening 64 in the mask 50 is removed with an etching process. Following the etching process, the mask 62 may be removed by, for example, oxygen plasma ashing or wet chemical stripping. The exposure of the top surface 36a of the emitter 36 provides access to form a contact to the emitter 36.

A bipolar device 70 is defined that includes multiple bipolar junction transistors 71a, 71b that are coupled in parallel. The bipolar junction transistor 71a of the bipolar device 70 includes an intrinsic base 68 defined by a portion of the intrinsic base layer 34, an extrinsic base 66 defined by one of the contact regions 44, and the collector 56. The bipolar junction transistor 71b of the bipolar device 70 includes an intrinsic base 69 defined by a portion of the intrinsic base layer 34, an extrinsic base 67 defined by another of the contact regions 44, and the collector 58. The emitter 36 is shared by the bipolar junction transistors 71a, 71b. The intrinsic bases 68, 69 are located on different sidewalls 29 that are opposite to each other across the width of the opening 28, and the emitter 36 and the intrinsic bases 68, 69 are juxtaposed with the emitter 36 between the intrinsic base 68 and the intrinsic base 69.

For bipolar junction transistor 71a, an emitter-base junction 72 is defined at the interface between the emitter 36 and the intrinsic base 68, and a collector-base junction 74 is defined at the interface between the intrinsic base 68 and the collector 56. For bipolar junction transistor 71, an emitter-base junction 73 is defined at the interface between the emitter 36 and the intrinsic base 69, and a collector-base junction 75 is defined at the interface between the intrinsic base 69 and the collector 58. The junctions 72-75 are vertically aligned in parallel relative to each other and the horizontal plane of the chip/substrate in the lateral construction of the bipolar device 70.

Due primarily to the use of masking, the spacings for the different collectors 56, 58 and, thereby, the breakdown voltages for the bipolar junction transistors 71a, 71b may be set by self-aligned ion implantations and silicide formation. If the spacings for the collectors 56, 58 differ, then the bipolar junction transistors 71a, 71b of the bipolar device 70 may exhibit different breakdown voltages. However, if the spacings for the collectors 56, 58 are the same, then the bipolar junction transistors 71a, 71b of the bipolar device 70 may exhibit the same breakdown voltage.

The bipolar junction transistors 71a, 71b of the bipolar device 70 may each be characterized as a heterojunction bipolar transistor if at least two of the emitter 36, the collectors 56, 58, and the intrinsic base 68, are comprised of different semiconductor materials. In the representative embodiment, the bipolar junction transistors 71a, 71b are NPN bipolar junction transistors that include regions of n-type semiconductor material constituting the emitter 36 and collectors 56, 58, and a region of p-type semiconductor material sandwiched between the regions of n-type semiconductor material to constitute the intrinsic bases 68, 69. However, the conductivity types may be reversed by changing the dopants introduced during the implantations so that bipolar device 70 is an PNP bipolar junction transistor During the front-end-of-line (FEOL) portion of the fabrication process, the device structure of the bipolar device 70 is replicated across at least a portion of the surface area of the substrate 10. A layer of photoresist may be applied to regions of the substrate 10 being used to form the bipolar devices 70 following this fabrication stage. Protective layers may be removed from other regions of the substrate 10 to form complementary metal-oxide-semiconductor (CMOS) field-effect transistors. The order in which the field-effect transistors and bipolar junction transistors are formed may be reversed. As a result, both bipolar junction transistors 71a, 71b and CMOS transistors may be available on the same substrate 10.

Figure 9:
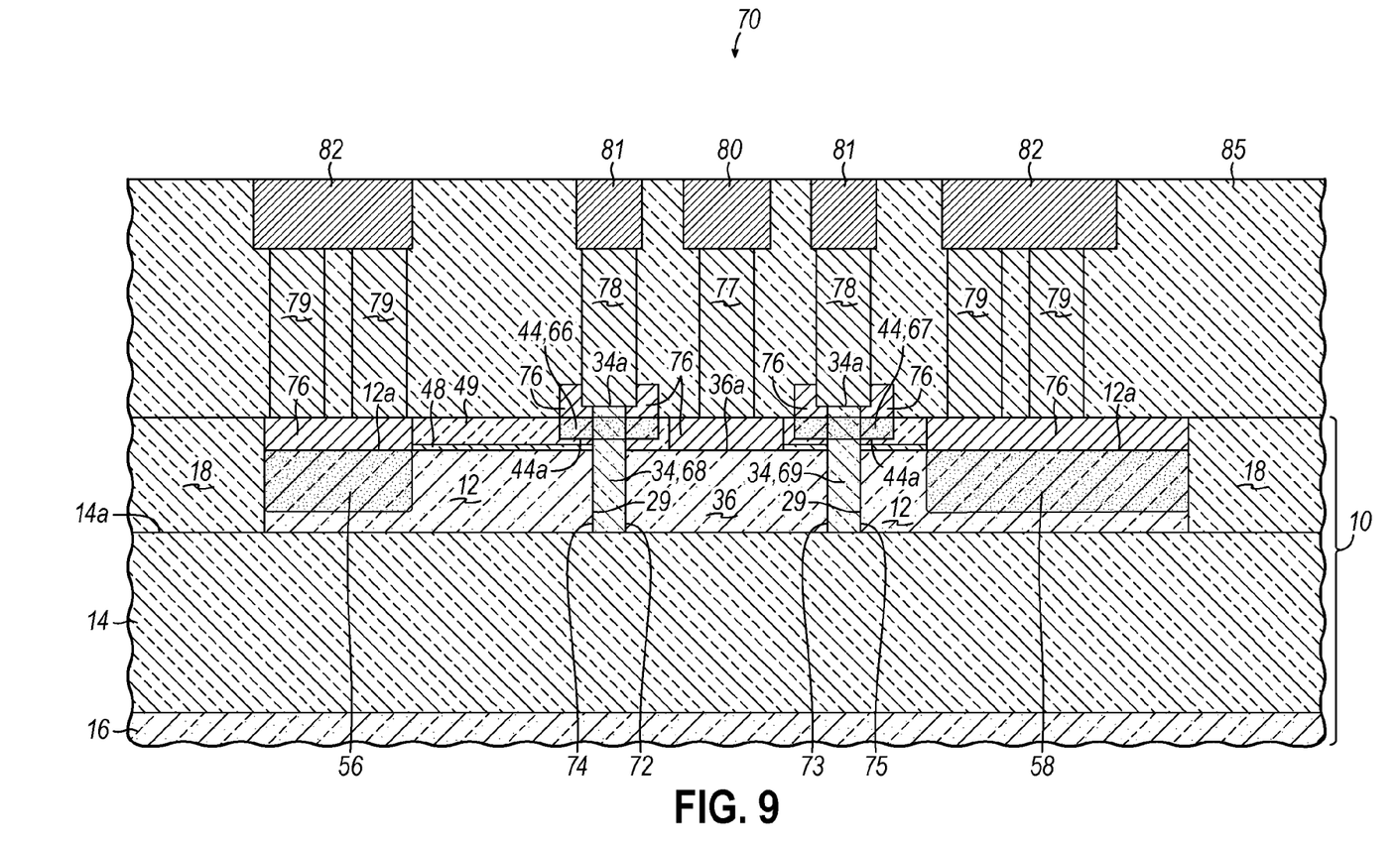

With reference to FIG. 9 in which like reference numerals refer to like features in FIG. 8 and at a subsequent fabrication stage of the processing method, middle-of-line (MOL) and back-end-of-line (BEOL) processing follows, which includes silicide formation, formation of contacts and wiring for the local interconnect structure to the bipolar device 70, and formation of dielectric layers, via plugs, and wiring for an interconnect structure coupled by the interconnect wiring with the bipolar device 70. Other active and passive circuit elements, such as diodes, resistors, capacitors, varactors, and inductors, may be integrated into the interconnect structure and available for use in the integrated circuit.

Sections 76 of a silicide layer are formed on the emitter 36, the extrinsic bases 66, 67, and the collectors 56, 58. The sections 76 of the silicide layer may be formed by a silicidation process that involves one or more annealing steps to form a silicide phase by reacting a layer of silicide-forming metal and the semiconductor material contacting the silicide-forming metal. Contacts 77-79 are formed in a dielectric layer 85 comprised of insulating material to provide respective electrical connections with the sections 76 of the silicide layer on the emitter 36, the extrinsic base 66, and the collectors 56, 58. Contacts 77 couple the section 76 of the silicide layer on the emitter 36 with wiring 80. Contacts 78 couple the sections 76 of the silicide layer on the extrinsic bases 66, 67 with wiring 81. Contacts 79 couple the sections 76 of the silicide layer on the collectors 56, 58 with wiring 82. The contacts 78 are comprised of a conductor, such as a refractory metal like tungsten (W), and may be clad with a conductive liner (e.g., titanium nitride (TiN)), the wiring 80-82 may be comprised of a conductor, such as copper, and may be clad with a conductive liner, and the dielectric layer 85 may be comprised of an electrically-insulating dielectric material, such as borophosphosilicate glass (BPSG).

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a bipolar device structure, the method comprising:
    forming an opening in a single-crystal device layer of a silicon-on-insulator substrate that includes a first sidewall and a second sidewall that each extend to a buried insulator layer of the silicon-on-insulator substrate;
    epitaxially growing a first portion of an intrinsic base layer within the opening in the device layer by lateral epitaxial growth and a selective epitaxial growth process from the device layer at the first sidewall of the opening; and
    epitaxially growing a second portion of the intrinsic base layer within the opening in the device layer by lateral epitaxial growth and the selective epitaxial growth process from the device layer at the second sidewall of the opening,
    wherein the intrinsic base layer is comprised of a single-crystal semiconductor material.

2. The method of claim 1 wherein the semiconductor material of the intrinsic base layer is comprised of silicon-germanium including a germanium content that is laterally graded across a width of the first portion of the intrinsic base layer relative to the first sidewall and across a width of the second portion of the intrinsic base layer relative to the second sidewall.

3. The method of claim 1 further comprising:
    forming a mask having a first opening and a second opening;
    forming a first collector of a first bipolar junction transistor by doping a first section of the device layer through the first opening in the mask; and
    forming a second collector of a second bipolar junction transistor by doping a second section of the device layer through the second opening in the mask.

4. The method of claim 3 wherein the first collector is positioned at a first spacing from the first sidewall of the opening, and the second collector is positioned at a second spacing from the second sidewall of the opening that is different from the first spacing.

5. The method of claim 1 further comprising:
    after the intrinsic base layer is epitaxially grown, forming an emitter by lateral epitaxial growth from the intrinsic base layer,
    wherein the emitter is located inside the opening between the intrinsic base layer on the first sidewall of the device layer and the intrinsic base layer on the second sidewall of the device layer.

6. The method of claim 1 further comprising:
    implanting the intrinsic base layer and the device layer adjacent to the intrinsic base layer to define a contact region for the intrinsic base layer.

7. The method of claim 6 further comprising:
    etching the device layer at a greater etch rate than the contact region,
    wherein top surface of the device layer is recessed relative to the contact region and the contact region is undercut to define a gap between the contact region and the top surface of the device layer.

8. The method of claim 7 further comprising:
    forming a dielectric layer in the gap.

9. The method of claim 1 further comprising:
    forming an emitter inside the opening between the first portion of the intrinsic base layer on the first sidewall of the device layer and the second portion of the intrinsic base layer on the second sidewall of the device layer.

10. A method of forming a bipolar device structure, the method comprising:
  forming an opening in a device layer of a silicon-on-insulator substrate with a first sidewall and a second sidewall opposite from the first sidewall that each extend to a buried insulator layer of the silicon-on-insulator substrate;
  forming a first collector of a first bipolar junction transistor at a first spacing from the first sidewall;
  forming a second collector of a second bipolar junction transistor at a second spacing from the second sidewall; and
  forming an emitter shared by the first bipolar junction transistor and the second bipolar junction transistor inside the opening.

11. The method of claim 10 further comprising:
  forming a mask having a first opening aligned with an intended location of the first collector and a second opening aligned with an intended location of the second collector,
  wherein the first collector and the second collector are respectively formed by implanting ions through the first opening and the second opening in the mask.

12. The method of claim 10 wherein the second spacing is different from the first spacing so that the first bipolar junction transistor has a first breakdown voltage and the second bipolar junction transistor has a second breakdown voltage different from the first breakdown voltage.

13. The method of claim 10 further comprising:
  forming a first intrinsic base of the first bipolar junction transistor inside the opening as a first portion of a layer on the first sidewall; and
  forming a second intrinsic base of the first bipolar junction transistor inside the opening as a second portion of the layer on the second sidewall.

14. The method of claim 13 wherein the emitter is formed after the first portion of the layer is formed on the first sidewall and the second portion of the layer is formed on the second sidewall.

* * * * *